United States Patent [19]

Kim

[11] Patent Number: 5,058,187
[45] Date of Patent: Oct. 15, 1991

[54] METHOD FOR COMPRESSING CHARACTER IMAGE DATA

[75] Inventor: Jeong Y. Kim, Seoul, Rep. of Korea

[73] Assignee: Goldstar Co., Ltd., Seoul, Rep. of Korea

[21] Appl. No.: 330,181

[22] Filed: Mar. 29, 1989

[30] Foreign Application Priority Data

Mar. 29, 1988 [KR] Rep. of Korea ............ 3453/1988[U]

[51] Int. Cl.$^5$ .................. G06K 9/36; H04N 1/415
[52] U.S. Cl. .................................. 382/56; 364/900; 358/426; 358/261.2
[58] Field of Search .................. 364/200, 900; 382/56; 358/426, 427, 430; 341/55, 65, 106

[56] References Cited

U.S. PATENT DOCUMENTS

| | | | |
|---|---|---|---|
| 4,068,224 | 1/1978 | Bechtle et al. | 358/426 |
| 4,513,444 | 4/1985 | Okai et al. | 382/56 |
| 4,542,412 | 9/1985 | Fuse et al. | 382/56 |
| 4,566,128 | 1/1986 | Araki | 382/56 |
| 4,703,516 | 10/1987 | Fukuda | 382/56 |
| 4,777,620 | 10/1988 | Shimoni et al. | 364/900 |
| 4,843,389 | 6/1989 | Lisle et al. | 341/106 |
| 4,876,607 | 10/1989 | Tseng | 358/261.2 |
| 4,899,148 | 2/1990 | Sato et al. | 341/65 |
| 5,003,307 | 3/1991 | Whiting et al. | 341/51 |

*Primary Examiner*—Michael R. Fleming
*Assistant Examiner*—Gopal C. Ray

[57] ABSTRACT

A method for compressing font data wherein, for example, each byte of a font is provided with a compressing code. A bit map of the font is stored in a font file which is separated into a reference byte and a comparator byte. The two bytes are compared with each other. In response to the comparison a specific compression code is assigned and stored in the compression file. In the comparison, the present byte of a font to be compressed is compared with a byte which is positioned immediately before the present byte. When no byte is positioned immediately before the present byte, the byte is compared with OOH.

8 Claims, 6 Drawing Sheets

| COMPARED RESULT | ASSIGNED COMPRESSION CODE | COMPARED RESULT | ASSIGNED COMPRESSION CODE |
|---|---|---|---|
| SAME | 0 | SL - OR | 10110 |
| WHITE | 1100 | SR - AND | 111110 |
| BLACK | 11010 | SL - OR | 10111 |
| SL | 111111 | REV | 1010 |
| SR | 11110 | REV | 100 |
| SL AND | 11011 | NEW | 1110 | a: REF. BYTE
b: COMP. BYTE
c: COMPR. CODE

FIG. 7

METHOD FOR COMPRESSING CHARACTER IMAGE DATA

BACKGROUND OF THE INVENTION

The present invention relates to a font system utilizing a font, for example, a numeral, character or symbol which is displayed on a screen of a ?. There is a printer, for example, a laser printer for printing one page as a unit, particularly the invention is directed to a font data compressing method which stores by compressing each byte of a font into a specific compression code.

Generally, a font system utilizing a font, as shown in FIG. 1, which includes a processor 1 for controlling the whole operation of the system, a font memory 2 for storing a font for example with respect to each numeral, character and symbol or the like, a frame buffer 3 for storing a font of amount of one page by the control of said processor 1, and a video signal producing means 4 for outputting the font stored in said frame buffer 3 as a video signal of serial form with synchronizing to a video clock signal by the control of said processor 1.

The font memory 2 may, for example a ROM, be stored semi-permanently with the font, or it may down loaded with the font from an auxiliary device such as a diskette such as a RAM.

According to the font system constructed as above, a processor 1 seeks the font to be output from the font memory 2 and stores it in a corresponding location of the frame buffer 3. In the font memory 2 there is stored with a same font with the font of last output outputting by storing in the frame buffer 3. That is to say, in a font memory 2 there is stored with a bit map font.

Thus, when a bit map font of the quantity of one page is stored in the frame buffer 3, a video signal producing means 4 outputs the bit map font stored in the frame buffer 3 as a serial video signal by the control of the processor 1 by synchronizing to a video signal clock.

A font system described is simple in processing and becomes relatively speedy in processing speed because of storing the bit map font of lastly outputting form as it is. There is a problem, that in selection of the font because many memories are required for storing one font in case where the number of dots which is the bit map size of a font is large since each separate font should be stored by each dimension. This is a very serious problem in case of processing a Korean character "Hangeul" and a Chinese character "Kanji" in a system requiring a high resolution such as a laser printer.

SUMMARY OF THE INVENTION

An object of the present invention is to provide a compressing method of a font capable of decreasing a utilizing capacity of a memory by storing each bytes of said font data by compressing without storing font data as they are.

An object of the present invention is achieved by adopting a previous byte among the font data as a reference byte and a present byte as a comparative byte, and comparing those two bytes, and according to said compared result, storing into a memory by assigning a specific compression code.

BRIEF DESCRIPTION OF THE DRAWINGS

FIG. 7 is an examplary diagram of the font for applying the compressing method of the present invention.

DETAILED DESCRIPTION OF THE INVENTION

Figure 1:
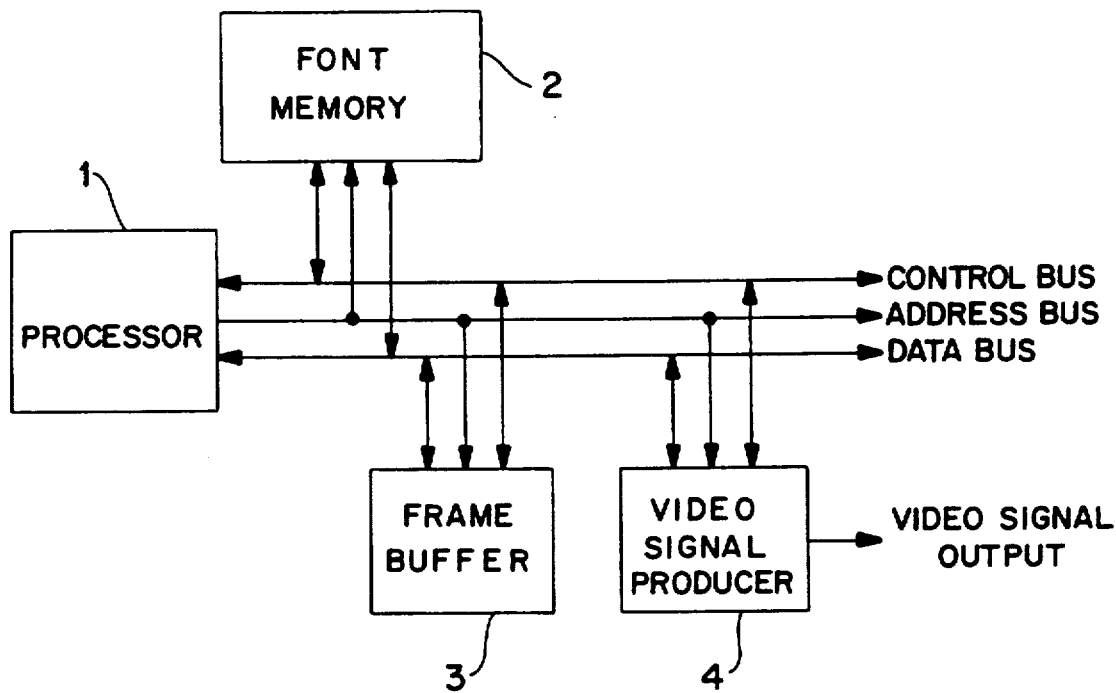
FIG. 1 shows a block diagram illustrating a conventional font system.
Figure 2:
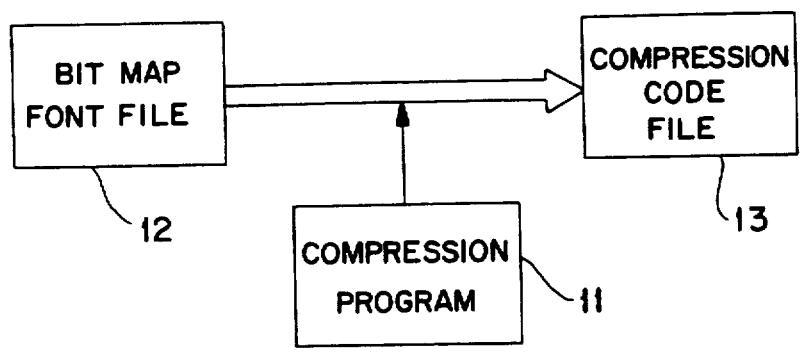
FIG. 2 is a block diagram showing a compressing process of a font data according to a compressing method of the present invention.
Figure 3:
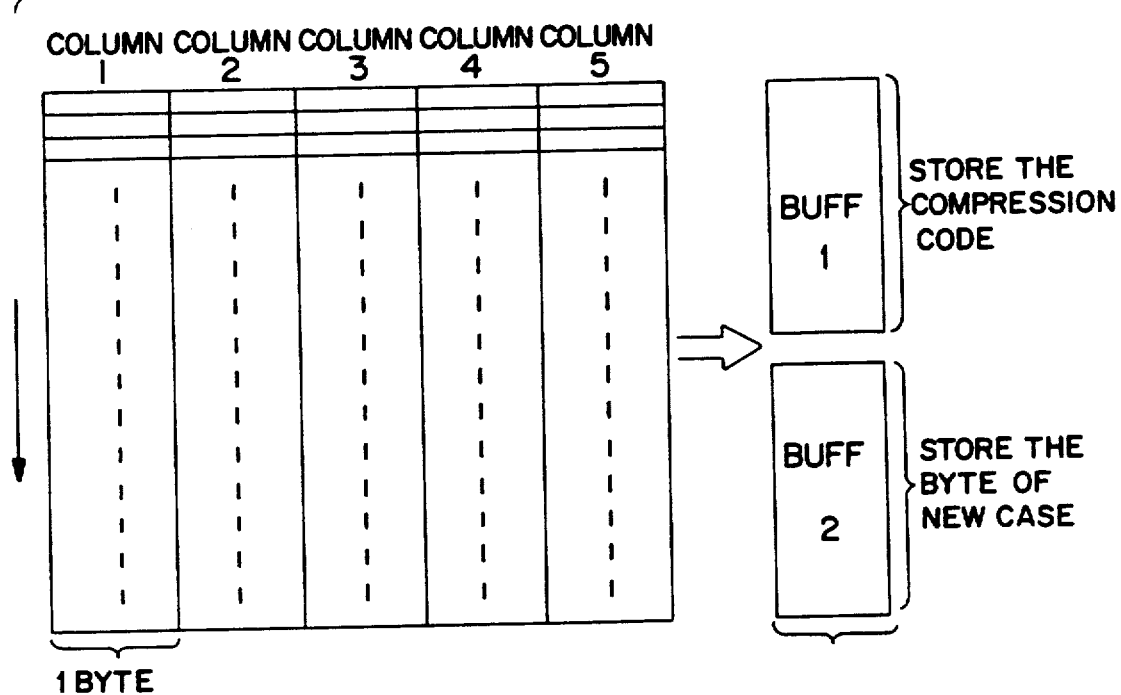
FIG. 3 is a schematic diagram showing the compressing sequence of a font data according to the compressing method of the present invention.

FIG. 2 is a block diagram showing a process for compressing the bit map font data according to the compressing method of the present invention. As illustrated in the drawing, a bit map font is stored in a bit map font file 12 and is compared according to a compression program 11 by separating into a reference byte and a comparative byte, and a specific compression code is assigned according to the compared result and stored in a compression code file 13. FIG. 3 is an explanatory diagram showing a sequence for compressing a font data, in which a compression of a font is carried out by dividing it into a column unit, and scanning from the top toward the bottom in a same column. A present byte of a font to be compressed is compared by adopting the byte immediately before as a reference byte. A first byte of each column is compared with 00H (in here, H represents a hexadecimal digit) as a reference byte because the first byte has no byte immediately before to be a reference. A specific compression code is assigned to each byte according to said compared result. When the compression of a font is carried out, it is stored respectively by dividing into a compressed data and a non-compressed data.

Figure 4:
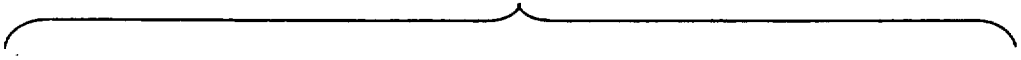
FIG. 4 is a table of a compression code assigning in response to the compared result according to the compressing method of the present invention.

FIG. 4 shows a table giving a specific compression code in response to the compared result of 12 kinds compared a reference byte with a comparative byte in accordance with the compressing method of the present invention, whose compression code is, after seeking an accumulative degree with respect to the 12 kinds by placing a Ming-style printing type font of Hangeul 40×40 dots as one set, given in optimum by a Hoffmann method from said statistical data.

This compression code assigning method will be explained in detail with reference to the comparative exemplary diagrams of FIGS. 5A to 5L.

Figure 5A:
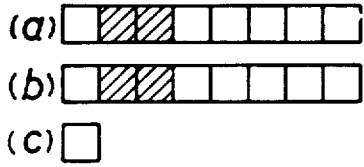
FIGS. 5A, 5B, 5C, 5D, 5E, 5F, 5G, 5H, 5I, 5J, 5K and 5L are schematic diagrams showing the comparative examples according to the compressing method of the present invention.
Figure 5B:
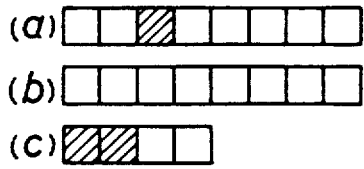
Figure 5C:
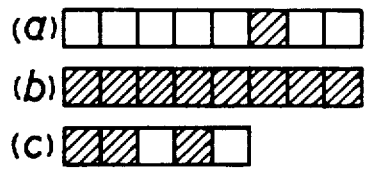
Figure 5D:
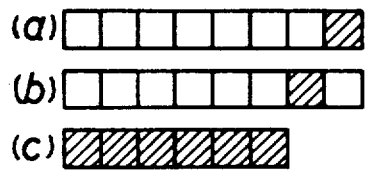
Figure 5E:
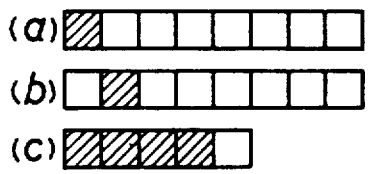
Figure 5F:
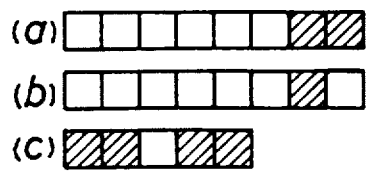
Figure 5G:
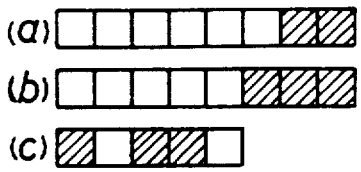
Figure 5H:
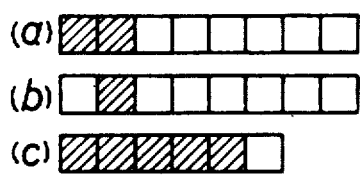
Figure 5I:
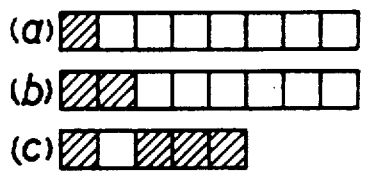
Figure 5J:
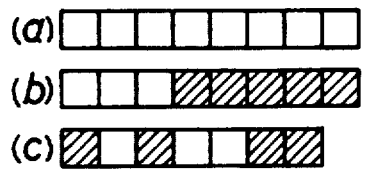
Figure 5K:
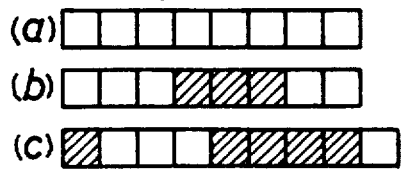
Figure 5L:
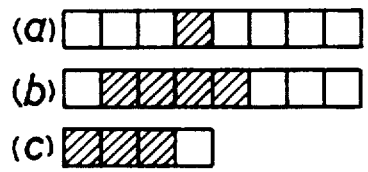

At first, as shown in FIG. 5A, when a reference byte and a comparative byte are same, as in case where a reference byte is 60H and a comparative byte which is a present byte to be compressed is 60H, a compression code "0" is assigned. As shown in FIG. 5B, in case where a comparative byte is not same with a reference byte and said byte is 00H (WHITE), a compression code "1100" is assigned. As shown in FIG. 5C, in case where a comparative byte is not same with a reference byte and said byte is FFH (BLACK), a compression code "11010" is assigned. As shown in FIG. 5D, when it becomes same with a comparative byte in case that a reference byte is shifted by one bit to left (SL) as in case where a reference byte is 01H and comparative byte is 02H, a compression code "111111" is assigned. As shown in FIG. 5E, when the reference byte is the same with a comparative byte in case that a reference byte is shifted by one bit to right (SR) as in case where a reference byte is 80H and a comparative byte is 40H, a compression code "11110" is assigned. As shown in FIG. 5F, when the reference byte becomes the same with a comparative byte in case that a reference byte is shifted by one bit to left thereafter it is ANDed with a reference byte (SL-AND) as in case where a reference byte is 03H and a comparative byte is 02H, a compression code "11011" is assigned. As shown in FIG. 5F, when it becomes same with a comparative byte in case that a reference byte is shifted by one bit to left thereafter it is ORed with a reference byte (SL-OR) as in case where a reference byte is 03H and a comparative byte is 07H, a compression code "10110" is assigned. As shown in FIG. 5H, when it becomes same with a comparative byte in case that a reference byte is shifted by one bit to right thereafter it is ANDed again with a reference byte (SR-AND) in case where a reference byte is C0H and a comparative byte is 40H, a compression code "111110" is assigned. As shown in FIG. 5I, when it becomes same with a comparative byte in case that a reference byte is shifted by one bit to right thereafter it is ORed again with a reference byte (SR-OR) as in case where a reference byte is 80H and a comparative byte is C0H, a compression code "10111" is assigned. As shown in FIG. 5J, when it becomes same with a comparative byte by reversing a reference byte after i-th bit (REV 1), that is to say, by reversing a reference byte after third bit as in case where a reference byte is 00H and comparative byte is 1FH, a compression code "1010" and "011" which designates third bit being l-th bit are assigned. As shown in FIG. 5K, when it becomes same with a comparative byte in case that a reference byte after i-th bit is reversed thereafter a byte after j-th bit is reversed again, that is to say, a reference byte after third byte is reversed thereafter a byte after 6-th bit is reversed again (REV 2) in case where a reference byte is 00H and a comparative byte is 1CH, a compression code "100", and "011" and "110" designating "6" which is i-th bit and "3" which is j-th bit are assigned. As shown in FIG. 5L, when any one among above eleven kinds does not correspond to therebetween as in case a reference byte is 10H and a comparative byte is 78H, a compression bit "1110" and its comparative byte 78H are assigned.

Figure 6:
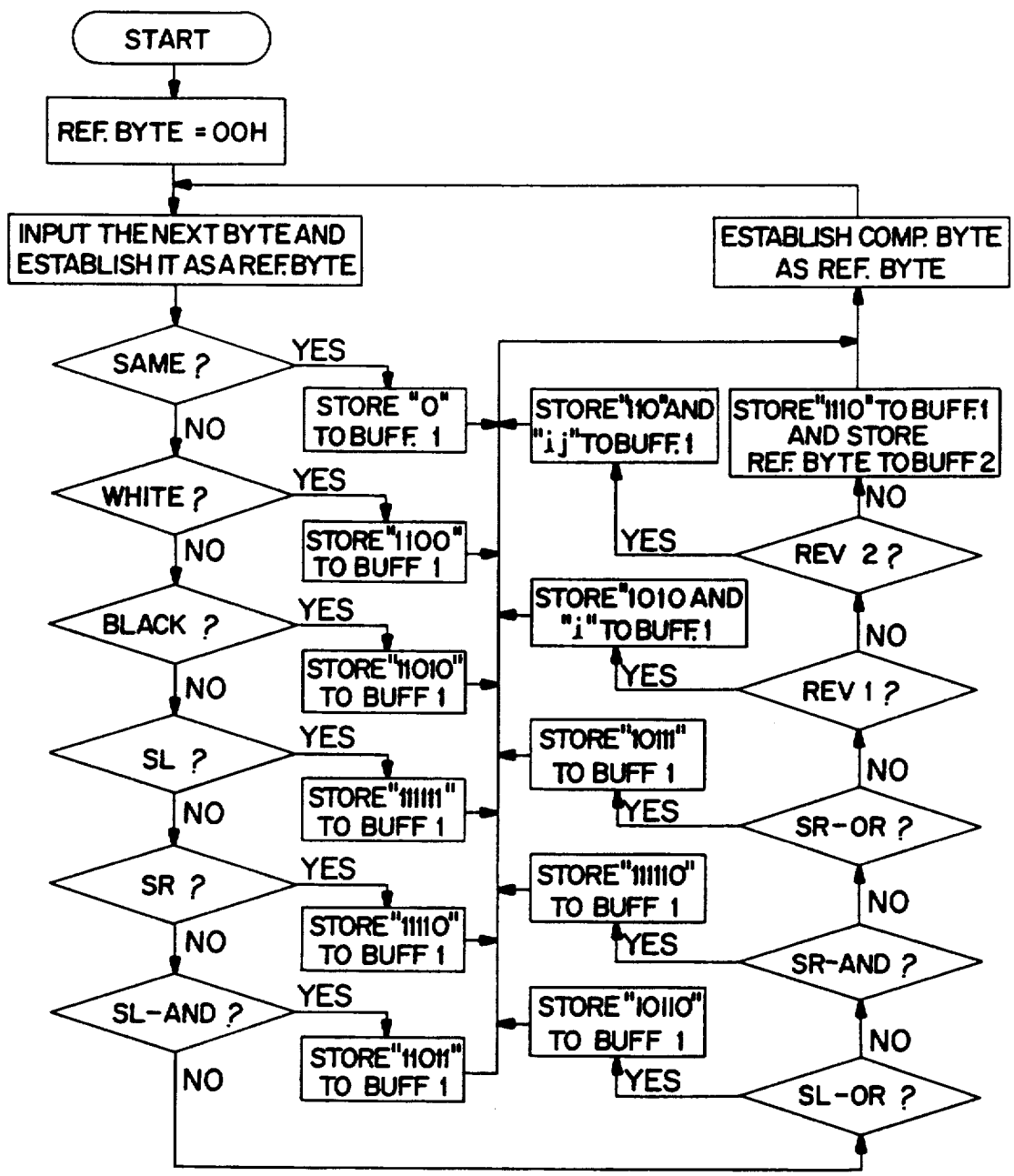
FIG. 6 is a flow chart illustrating the compressing method of the present invention.

FIG. 6 is a signal flow chart showing a method for compressing a font data according to a compressing method of the present invention, in which firstly 00H as a basic byte is established, and the first byte of a column is read out and it is established as a comparative byte thereafter they are compared. At this moment, a compression code "0" is stored to a buffer 1 when a comparative byte is same with a reference byte, a compression code "1100" is stored to a buffer 1 when a comparative byte is 00H, that is to say, a comparative byte is all white, a compression code "11010" is stored to a buffer 1 when a comparative byte is FFH, that is all black, a compression code "111111" is stored to a buffer 1 when it is same with a comparative byte in case that a reference byte is shifted by one bit to left (SL), a compression code "11110" is stored to a buffer 1 when it is same with a comparative byte in case that a reference byte is shifted by one bit to right (SR), a compression code "11011" is stored to a buffer 1 when it is same with a comparative byte in case that a reference byte is shifted by one bit to left thereafter it is ANDed again with a reference byte (SL-AND), a compression code "10110" is stored to a buffer 1 when it is same with a comparative byte in case that a reference byte is shifted by one bit to left thereafter it is ORed again with a reference byte (SL-OR), a compression code "111110" is stored to a buffer 1 when it is same with a comparative byte in case that a reference byte is shifted by one bit to right thereafter it is ANDed again with a reference byte (SR-AND), a compression code "10111" is stored to a buffer 1 when it is same with a comparative byte in case that a reference byte is shifted by one bit to right thereafter it is ORed again with a reference byte (SL-OR); when it is same with a comparative byte in case that a reference byte after i-th bit is reversed (REV 1), then a compression code "1010" is stored to a buffer 1 at the same time said "1" is stored with three bits; when it is same with a comparative byte in case that a reference byte after i-th byte is reversed thereafter a byte after j-th byte is reversed again (REV 2), then a compression code "100" is stored to a buffer 1 at the same time said "1" and "j" are sequentially stored with three bits respectively; when it is the case that is does not correspond to the case of aforementioned eleven kinds (NEW), then a compression code "1110" is stored to a buffer 1 at the same time its comparative byte is stored to a buffer 2.

Thereafter, said comparative byte is established as a reference byte, and the next byte is read out and it is established as a comparative byte thereafter aforementioned comparing operation is carried out repeatedly, and then a compression code is stored to a buffer 1 at the same time a comparative byte which is not compressed is stored to a buffer 2.

An applied example of a compressing method of the present invention as described above will be explained with reference to a case of FIG. 7 hereinafter.

Figure 7:
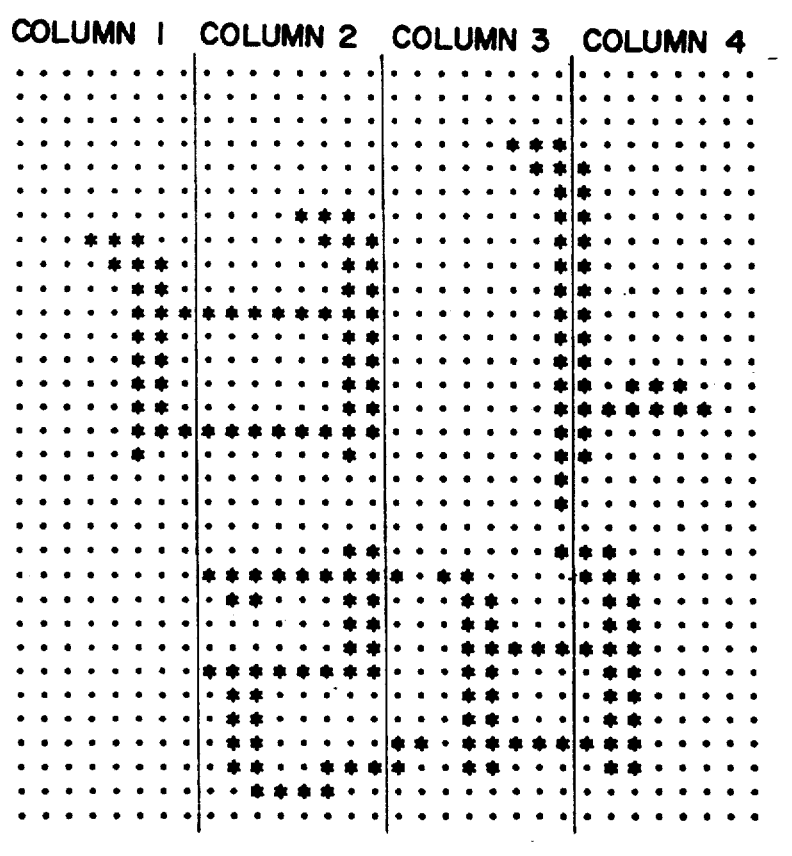

FIG. 7 is an exemplary diagram of a font with respect to a Hangeul character "벼", in which when a font with regard to a column 1 is compressed by said compressing method of the present invention, it is shown in table 1 as below.

TABLE 1

| byte No. | compared result | compression code | non-compression code |
|---|---|---|---|
| 1-7 | SAME | 0 | |
| 8 | REV 2 | 100 | 011, 101 |
| 9 | SR | 11110 | |
| 10 | SR-AND | 111110 | |
| 11 | SR-OR | 10111 | |
| 12 | SL-AND | 11011 | |
| 13-15 | SAME | 0 | |
| 16 | SR-OR | 10111 | |
| 17 | REV 1 | 1010 | 110 |
| 18 | WHITE | 1100 | |
| 19-32 | SAME | 0 | |

That is to say, it is assigned with each compression code "0" because a reference byte and a comparative byte are the same from first byte to 7th byte of column 1, when 8th byte reverses a byte after 3rd bit of 7th byte which is a reference byte and reverses again a byte after 6th bit, it becomes the same with 8th byte which is its comparative byte, therefore a compression code "100" is assigned at the same time non-compression codes "011", "101" which represent their 3rd bit and 6th bit are assigned; and when 9th byte shifts the 8th byte which is a reference byte by one bit to 10 right, it becomes same with the 9th byte which is its comparative byte, therefore a compression code "11110" is assigned. When all bytes of column 1 are compressed by these method, the compression codes and the non-compression codes are assigned as shown in table 1, and then these compression codes are stored in a buffer 1 and the non-compression codes are stored in a buffer 2.

Wherein, the compression codes become to 61 bits and the non-compression codes become to 9 bits thereby there are 70 bits in total. Therefore, they become to take merely 27.3% relative to 256 bits ($=32\times 8$ bits) which are the total bit number of column 1 that is not compressed.

As described above in detail, according to the present invention each of the bytes of a font data are compressed and then stored, the capacity for storing them in the memory becomes decreased and accordingly a large quantity of font data can be stored therein, and there is also an effect that a capacity of the memory can be saved up to about 75% in the case of Hangeul Ming-style printing type of $40\times 40$ dots.

What is claimed is:

1. A method for compressing character image data, comprising the steps of:
   (a) dividing a character image data into a plurality of column units;
   (b) scanning from a top byte of each column unit toward a bottom byte of said each column unit;
   (c) comparing a present byte with a comparative byte, the comparative byte being a previous byte before the present byte;
   (d) assigning a predetermined compression code according to the result of said comparing step; and
   (e) storing the result of said assigning step in at least one memory means.

2. A method for compressing character image data according to claim 1 wherein the comparing step is a case selected from the group consisting of:
   a case that said present byte and said comparative byte are same,
   a case that said comparative byte is OOH,
   a case that said comparative byte is FFH,
   a case that said comparative byte is same as a present byte shifted by one bit to the left,
   a case that said comparative byte is same as a present byte shifted by one bit to the right,
   a case that said comparative byte is same as what said present byte and a present byte shifted by one bit to the left are ANDed,
   a case that said comparative byte is same as what said present byte and a present byte shifted by one bit to the left are ORed,
   a case that said comparative byte is same as what said present byte and a present byte shifted by one bit to the left are ANDed,
   a case that said comparative byte is same as what said present byte and a present byte shifted by one bit to the left are ORed,
   a case that said comparative byte is same as a byte which is reversed after l-th bit of said present byte, or
   a case that said comparative byte is same as a byte which is reversed after l-th bit of said present byte and is reversed again after j-th bit of said present byte.

3. A method for compressing character image data according to claim 2, wherein said compression data is assigned in optimum by a Hoffman method after seeking a statistical accumulative degree with respect to said cases.

4. A method for compressing character image data according to claim 3, wherein said result of said assigning step is respectively stored after being divided into a compressed data and a non-compressed data.

5. A method for compressing character image data according to claim 2, wherein said result of said assigning step is respectively stored after being divided into a compressed data and a non-compressed data.

6. A method for compressing character image data according to claim 1, wherein said result of said assigning step is respectively stored after being divided into a compressed data and a non-compressed data.

7. A method for compressing character image data, comprising the steps of:
   (a) dividing a character image data into a plurality of column units;
   (b) scanning from a top byte of each column unit toward a bottom byte of said each column unit;
   (c) comparing a present byte, which is a first byte of each column unit, with OOH;
   (d) assigning a predetermined compression code according to the result of said comparing step; and
   (e) storing the result of said assigning step to at least one memory means.

8. A method for compressing character image data according to claim 7, wherein said result of said assigning step is respectively stored after being divided into a compressed data and a non-compressed data.

* * * * *